United States Patent [19]

Meckel

[11] Patent Number: 4,487,675

[45] Date of Patent: * Dec. 11, 1984

[54] MAGNETICALLY-ASSISTED SPUTTERING METHOD FOR PRODUCING VERTICAL RECORDING MEDIA

[76] Inventor: Benjamin B. Meckel, Rte. 1, Box 52M, Del Mar, Calif. 92104

[ * ] Notice: The portion of the term of this patent subsequent to Nov. 8, 2000 has been disclaimed.

[21] Appl. No.: 546,411

[22] Filed: Oct. 28, 1983

Related U.S. Application Data

[63] Continuation-in-part of Ser. No. 462,564, Jan. 31, 1983, Pat. No. 4,414,087.

[51] Int. Cl.³ ............................................. C23C 15/00
[52] U.S. Cl. ........................ 204/192 M; 204/192 R; 204/298
[58] Field of Search ................................. 204/192 M

[56] References Cited

U.S. PATENT DOCUMENTS

| | | | |
|---|---|---|---|
| 4,299,678 | 11/1981 | Meckel | 204/192 M |
| 4,324,631 | 4/1982 | Meckel et al. | 204/192 M |
| 4,414,087 | 11/1983 | Meckel | 204/192 M |

OTHER PUBLICATIONS

Kadokura et al., IEEE Transactions on Magnetics, vol. MAG-17; No. 6; Nov. 1981.
Meckel et al., Research Disclosure, Oct. 1979, pp. 537-540.

*Primary Examiner*—Arthur P. Demers
*Attorney, Agent, or Firm*—Bruno J. Verbeck; Michael L. Slonecker

[57] ABSTRACT

Disclosed is a method for producing vertical recording media by using magnetically-assisted sputtering apparatus to sputter from a magnetic target while selected portions of the target are heated to a temperature at or above Curie. Also disclosed are improved means for supporting the magnetic target during sputtering which permits the realization of enhanced sputtering efficiencies.

2 Claims, 2 Drawing Figures

MAGNETICALLY-ASSISTED SPUTTERING METHOD FOR PRODUCING VERTICAL RECORDING MEDIA

CROSS-REFERENCE TO RELATED APPLICATION

This application is a continuation-in-part of U.S. Ser. No. 462,564 filed Jan. 31, 1983, now U.S. Pat. No. 4,414,087.

BACKGROUND OF THE INVENTION

This invention pertains to an improved method for forming vertical recording media, i.e.-magnetic tapes or discs, using magnetically-assisted sputtering techniques. It also pertains to certain improvements in apparatus adaptable for practice of the improved method.

Because of the economies involved, magnetic data storage continues to be an attractive alternative to solid-state data storage. Magnetic media employed in magnetic data storage are generally classifiable by the manner in which the data is recorded thereupon. The first such class is longitudinal recording and refers to the fact that the magnetic layer is magnetizable only in a direction generally parallel to the surface of the magnetic tape or disc. The other class is referred to as vertical recording and signifies that the magnetic layer is magnetizable in a direction generally perpendicular to the surface of the magnetic tape or disc. Because it is theoretically feasible to achieve data bit densities as high as $3 \times 10^8$ bits per square inch using vertical recording, as compared with a theoretical limit of $2.5 \times 10^7$ bits per square inch using conventional longitudinal recording, tremendous impetus exists for the development of vertical recording media.

Vertical recording media derives its unique behavior from a magnetic property known as uniaxial magnetic anisotropy. This property is found in materials having closely packed hexagonal crystal structures and which are magnetizable along a single axis of the crystal. Because cobalt exhibits a substantial degree of uniaxial magnetic anisotropy, it has been used to grow perpendicularly anisotropic magnetic films for vertical recording.

In order to produce vertically magnetic films it is necessary that the anisotropy field be greater than the demagnetization field normal to the surface of the tape or disc. This is ususally attained by introducing a non-magnetic metal, such as chromium, into the cobalt hexagonal structure. Chromium is typically introduced in the amount of about 12 to 20 percent.

Hitherto, the formation of vertical recording media utilizing magnetically-assisted sputtering techniques has required substantial modification of conventional sputtering apparatus. Such modifications were necessitated by the fact that a magnetic sputtering target tends to shunt the lines of magnetic flux produced by the devices, thus precluding the realization of the enhanced efficiencies obtainable by magnetically-assisted sputtering.

An example of magnetically-assisted sputtering apparatus for avoiding the aforementioned magnetic flux shunting problem, while at the same time permitting the formation of vertical recording media, is set forth in Kadokura et al., "Deposition of Co-Cr Films for Perpendicular Magnetic Recording by Improved Opposing Targets Sputtering", IEEE Transactions on Magnetics, Vol. MAG-17, No. 6, Nov. 1981, pp 3175–3177. Briefly, therein is described sputtering apparatus including a spaced pair of facing cathodes each having a cobalt-chromium target (18.5% Chromium) attached thereto. Positioned to one side outside the volume defined by the space between the facing targets is a substrate upon which target material is to be deposited. The actual deposition process is otherwise conventional and material ejected from the target is caused to impinge upon the substrate, thus forming vertical recording media.

Another example of apparatus for avoiding the aforementioned magnetic flux shunting problem is set forth in Meckel, U.S. Pat. No. 4,299,678 and Meckel et al., U.S. Pat. No. 4,324,631. Both Meckel and Meckel et al. teach that the magnetic flux shunting problem which arises when using a magnetic target with conventional magnetically-assisted sputtering apparatus can be substantially mitigated by heating the magnetic target to near or above its Curie temperature, thus temporarily rendering the target non-magnetic. While in such a non-magnetic state the target does not shunt any appreciable amount of magnetic flux and, thus, the magnetic flux is able to penetrate and project beyond the volume of the target to thereby densify the sputtering plasma. While Meckel and Meckel et al. do teach that cobalt is a magnetic material which will act to shunt magnetic flux, they each fail to note that the Curie temperature for Cobalt is in the order of about 1100° C. Nothing is contained therein which suggests how to obtain a cobalt-containing magnetic film without having to heat the target to such an extreme temperature.

SUMMARY OF THE INVENTION

According to this invention vertical recording media is formed by sputtering a magnetic target while the target is heated to about its Curie temperature, the target being formed from material known to produce a magnetic film when sputtered upon a substrate which is magnetizable in a direction generally normal to the substrate. Such a target may comprise, for example, about 5 to 20 percent chromium and about 80–95 percent cobalt, the cobalt defining vertically magnetizable domains in the finished product, and the chromium serving to both control vertical self-demagnetization of the product as well as reduce the Curie temperature of the magnetic target itself.

This invention also includes improved means for supporting the target within sputtering apparatus such that enhanced magnetic flux coupling is obtained which permits the realization of enhanced sputtering efficiencies.

DETAILED DESCRIPTION OF THE PREFERRED EMBODIMENT

Because an aspect of this invention pertains to an improvement upon the apparatus disclosed in Meckel, U.S. Pat. No. 4,299,678 and Meckel et al., U.S. Pat. No. 4,324,631, both Meckel and Meckel et al. are expressly incorporated by reference herein.

In the ensuing description of this invention, the magnetically-assisted sputtering apparatus is described as a magnetron of the so-called "planar" type. However, persons skilled in the art will readily appreciate that the particular geometry of the magnetic elements of the magnetron have no substantive effect on the operation of the invention and that the invention has utility in other types of magnetron sputtering apparatus. Moreover, it will be appreciated that the expression "magnetic material" as used herein describes both materials exhibiting magnetic properties prior to being used in the to-be-described sputtering apparatus and method, as well as materials which are readily magnetizable and which become magnetized when subjected to the magnetic field of the magnetron.

Figure 1:
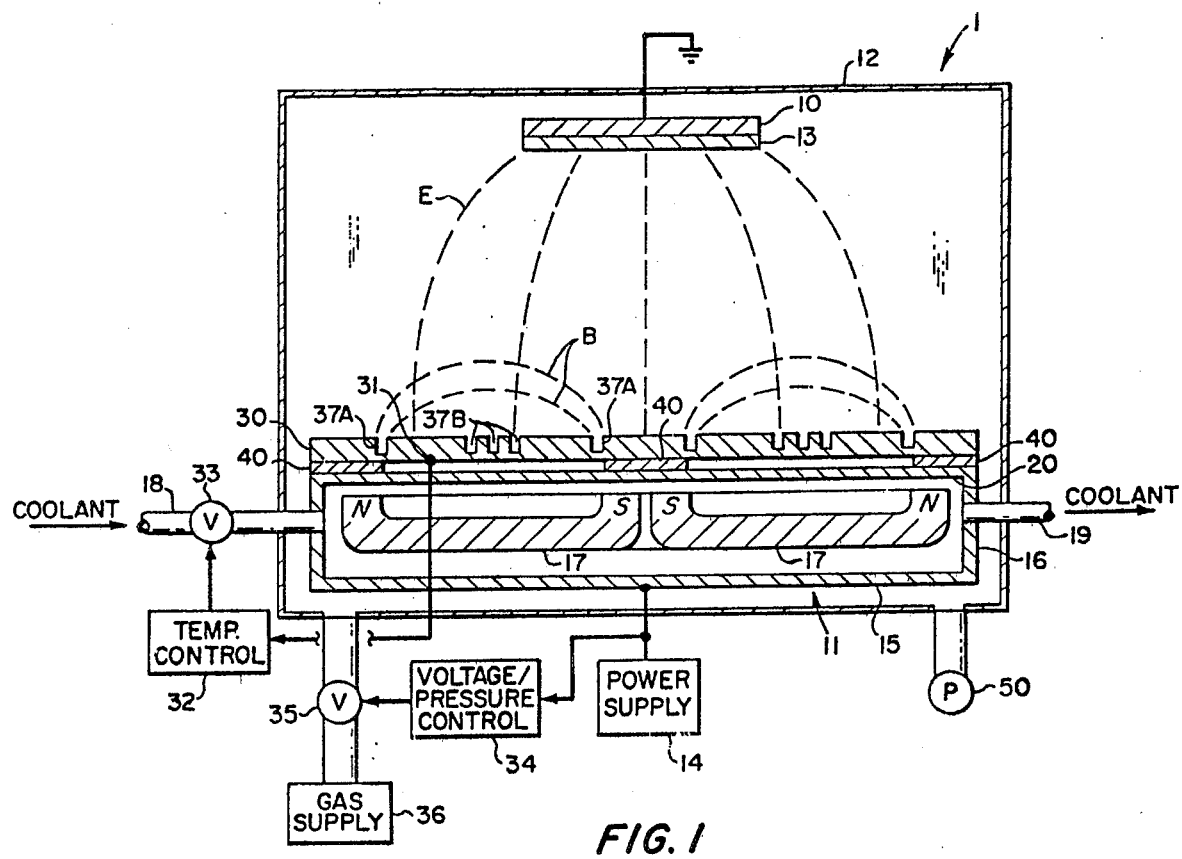
FIG. 1 is a cut-away side view of improved apparatus constructed in accordance with this invention.

Referring now to FIG. 1, therein is shown a magnetron sputtering apparatus 1 of the type disclosed in Meckel and Meckel et al., and which incorporates into the structure thereof the improvement of this invention. Briefly, apparatus 1 comprises an anode 10 and a cathode 11, each of which are supported within a vacuum chamber 12. Anode 10 may be in the form of an electrically conductive plate which, during the sputtering process, is adapted to support and retain a substrate 13 on which a sputtered film is to be deposited. Typically, anode 10 is connected to ground potential and cathode 11 is connected to a negative voltage from a power supply 14, either DC or RF, which serves to establish an intense electric field between the anode and cathode. The electric field is generally represented by the dashed lines identified by reference character E. It is because of this electric field that gas molecules in the region between the anode and cathode are ionized to thereby produce a gaseous plasma comprising free electrons and ions.

Cathode 11 preferably takes the form of a planar magnetron 15, and such a magnetron typically comprises a non-magnetic (e.g.-aluminum or stainless steel) housing 16 within which is positioned a closed-loop array of permanent magnets 17. Tubular conduits 18 and 19 are connected on opposite sidewalls of housing 16 for communicating a fluid coolant (e.g.-water) through housing 16. Magnets 17 are typically trough-shaped in transverse cross section and are positioned within housing 16 such that the north and south poles thereof are directed generally towards anode 10. The magnets themselves are generally arranged in closed-loop fashion and resemble, after assembly, a racetrack. By virtue of their arrangement, the magnetic flux produced by magnets 17 results in the formation of a magnetic field which projects outwardly beyond the volume of cathode 11 in the general direction of anode 10. The magnetic field produced by magnets 17 is generally represented by the dashed lines identified by reference character B.

Planar magnetron 15 is adapted to support and retain on its upper wall 20 a target plate 30 comprising the material to be sputtered. When the target plate 30 is non-magnetic, apparatus 1 operates in conventional fashion, i.e.-magnetic flux penetrates the target and acts to densify and confine the gas plasma produced by the electric field and the cathode. This densified plasma in turn enhances ion bombardment of the target surface and thus significantly increases the deposition rate of sputtered material on the substrate 13.

As taught in Meckel and Meckel et al., when target 30 is formed from either magnetic or readily magnetizable material, the magnetic flux produced by magnets 17 is shunted such that little, if any, of the magnetic flux projects beyond the volume of target 30 towards substrate 13. The shunting of magnetic flux through a target maintained in a magnetic condition can be avoided by temporarily substantially reducing the saturation magnetization of the target. The temporary demagnetization of the target is effected by heating the target to a temperature at or above its Curie temperature, i.e. - the temperature at which the magnetic domains of the material forming the target become randomly oriented. While in a substantially demagnetized state, the magnetic flux penetrates the target and produces the magnetron effect in the region intermediate the target and substrate 13. Heating of the target to its Curie temperature can be effected in any one of a variety of ways, such as, for example, infrared radiation-emitting lamps (not shown) arranged within vacuum chamber 12 and directed such that their radiant energy output is caused to irradiate target 30. Alternatively, electrical resistance heaters (also not shown) can be arranged in thermal communication with target 30 to thereby heat the target.

Once target 30 has exceeded its Curie point by about 10° to 15° C., the target temperature is then maintained at a substantially constant level. Means for maintaining the target at said level must necessarily include some means for detecting target temperature and for controllably adjusting the target temperature. This is accomplished by a conventional feedback network comprising a temperature sensor 31, a temperature controller 32, and a valve 33 which controls the rate at which fluid coolant flows through housing 16. Sensor 31 may comprise, for example, a thermocouple arranged in thermal contact with target 30 to sense the target temperature directly. Of course, other temperature sensitive devices may be employed. Sensor 31 provides an output signal indicative of the target temperature to contoller 32, the controller comprising any conventional thermostat. The output of the temperature controller 32 is then used to control the action of valve 33 which, in turn, controls the flow rate of the coolant. The coolant passed by valve 33 flows through conduit 18 into housing 16 and, upon thermal exchange with housing 16 and magnets 17, is discharged through conduit 19. Since target plate 30 is thermally coupled to the upper surface of housing 16, the target temperature varies directly with the temperature of the magnetron. By this temperature feedback arrangement, the target temperature is prevented from reaching a temperature at which it begins to melt or otherwise undergo undesired physical or chemical changes. Target temperature can also be controlled by using the output of controller 32 to control the electrical energy applied to the aforesaid infrared lamps and electrical resistance heaters, when such heating devices are used to heat the target plate.

Rather than heating target 30 by external means such as the aforesaid lamps and heaters, it is preferrable to heat target 30 by means of the thermal energy inherent in the sputtering process. This is accomplished by initially operating apparatus 1 in a conventional diode mode until target 30 has reached a predetermined temperature. At that time apparatus 1 is switched to the conventional magnetron mode. This is accomplished by a power supply 14 capable of providing a high voltage (e.g.-2000 volts) which is necessary for the diode mode, as well as high current (e.g.-5.0 amps) which is required for the magnetron mode. Power supply 14 additionally exhibits relatively high impedance (e.g.-1,500 ohms) and is able to suppress arcing. A suitable high voltage, high current power supply is the Model RDC 3-500 manufactured by Megavolt Corporation.

When a high negative voltage (either DC or RF) is applied to housing 16 from power supply 14 and chamber 12 is filled with an inert gas (e.g.-argon) at low pressure (e.g.-25 microns of Hg), the gas is ionized to produce a relatively rarified plasma between anode 10 and cathode 11. This is the so-called "diode" mode of operation and the cathode/anode current stabilizes at about 200 milliamps. The gas plasma comprises free electrons and positively charged ions which are accelerated by the applied electric field. Because cathode 11 is maintained at a relatively large negative potential with respect to anode 10, the relatively massive positive ions are attracted towards anode 11 and thus caused to bombard the target 30. Ionic bombardment of the target increases its temperature and, as the target temperature approaches the Curie point, magnetic flux from the magnetron penetrates target 30 and densifies the plasma. Plasma densification has the effect of substantially increasing the rate at which target 30 is bombarded by ions, as well as the cathode/anode current. As the current increases to several amps, the voltage drops to about 700 volts and the system then operates in the conventional magnetron mode. In order to sustain the plasma during the changes in voltage and current, a voltage/pressure controller 34 is used which is capable of monitoring the output voltage of the power supply 14 and controlling the pressure of the gas contained in chamber 12. Such control is effected via a fast-acting piezoelectric valve 35 which controls the flow of argon gas from a gas supply 36 into chamber 12. Controller 34 may be the Plasmaflow instrument made by Vacuum General.

As thus far described, device 10 is substantially identical to the apparatus disclosed in Meckel and Meckel et al. The shape of target 30 is also substantially identical to the target disclosed in those patents and preferrably includes a plurality of grooves 37A and 37B for the same purposes as discussed in the patents. Briefly, grooves 37A serve to maintain the temperature of the target 30 mass directly above each of the poles of the magnets 17 at a temperature below the Curie point of the target so that this mass acts as an extended pole tip of each magnet. Grooves 37B are positioned to effect the selective increase of magnetic reluctance of the target 30.

In Meckel and Meckel et al., the target to be sputtered from is supported in spaced apart thermal relationship with the cathode by a plurality of thin silicon wafers. The wafers are positioned such that they are in thermal communication with the housing as well as both the central and peripheral portions of the target which fall outside of the lines of magnetic flux penetrating through the target. As a consequence of such construction an air gap exists intermediate the housing and target directly above the poles of each of the magnets. A drawback associated with said air gap is that its presence detracts somewhat from the total volume of magnetic flux which is able to penetrate and project beyond the target volume. This drawback is now largely eliminated by the introduction of spacers 40 formed from magnetic material such as, for example, soft magnetic iron. The dimensions of spacers 40 are selected so as to extend over the entire pole piece of each magnet 17, but not the area between the pole pieces represented by the trough defined by the magnets. By this arrangement magnetic flux emanating from the poles of each magnet 17 is thus more efficiently coupled for penetration through target 30. This assists in the formation of a magnetic field which can more efficiently act upon the gas plasma, thereby producing more effective electron confinement. An additional desirable effect of this construction is that the temperature of those portions of the target 30 directly over the poles of magnets 17 can be more easily and accurately controlled. This feature will be readily understood by one skilled in the art who considers that Meckel and Meckel et al., by their positioning of their silicon safers, withdraw heat from those portions of their target above the pole pieces by transfering that heat through the target volume towards the periphery thereof for eventual thermal exchange through the silicon wafers. This results in a horizontal heat gradient across those portions of the target directly above the poles. In contrast, spacers 40 of this invention extract heat directly from those portions and thus serve to prevent the formation of such a heat gradient.

Figure 2:
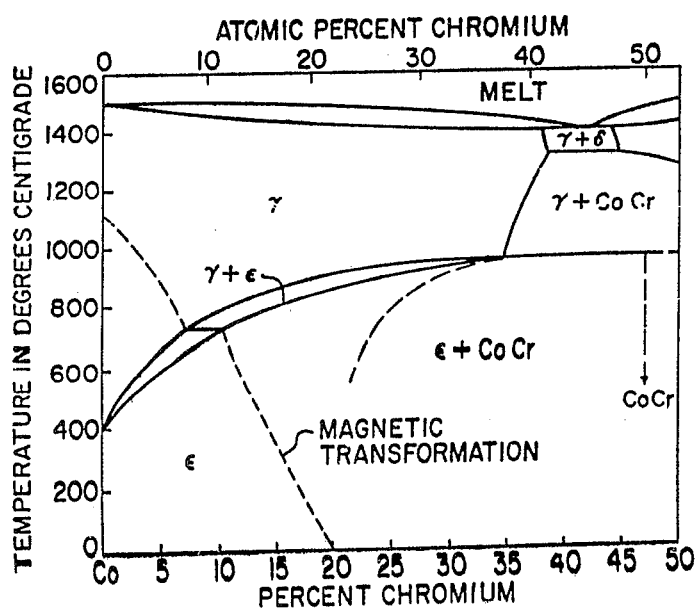
FIG. 2 is a phase diagram of cobalt-chromium alloys.

The method of this invention for producing vertical recording media may be practiced utilizing either the apparatus of Meckel and Meckel et al. or the improved apparatus as previously described. Hitherto, magnetic sputtering methods for producing vertical recording media were unable to overcome the magnetic flux shunting problems associated with sputtering from magnetic targets and, thus, the substrate upon which the magnetic film was to be deposited had to be supported in other than opposed facing relationship with the target. With the advent of Meckel and Meckel et al. it was possible to overcome the magnetic flux shunting problems altogether. However, until now the problem still remained of how to deposit a magnetic film exhibiting uniaxial magnetic anisotropy under controlled conditions and using conventional magnetron apparatus. Cobalt, which exhibits the preferred magnetic properties for vertical recording media, has a Curie temperature of about 1100° C., and such a temperature is in the white-hot thermal range which is extremely difficult to accommodate in conventional sputtering systems. The solution to this problem is best understood by now referring to FIG. 2 which is a phase diagram for cobalt-chromium alloys. A magnetic transformation line is identified in the figure and is indicative of the manner by which Curie temperature changes for cobalt-chromium alloys as the percent of chromium in the alloy is increased. It will be noted that between about 5 to 20 percent chromium the Curie temperature of the alloy varies substantially linearly from about 900° C. down to about ambient room temperature. The maintenance of a sputtering target during the sputtering operations within this operative range is quite easily effected by the apparatus described with reference to FIG. 1 and, thus, the formation of vertical recording media characterized by uniaxial magnetic anisotropy is readily achieved. The use of a cobalt-chromium alloy to achieve a reduction in Curie temperature over that of pure cobalt has the additional desirable effect, as previously explained, of incorporating into the magnetic film means for ensuring that the anisotropy field remains greater than the demagnetization field. This ensures that magnetization is maintained in a direction generally perpendicular to the film.

In practicing the method of this invention a cobalt-chromium alloy is first prepared from the melt and then poured from a liquid state. A suitable value for chromium is about 15 percent as the resultant alloy has a magnetic transformation, i.e.-Curie temperature, of about 300° C. The preferred dimensions of the cobalt-chromium alloy target are about 12 inches by 10 inches by 0.25 inches. The cathode is likewise of about the same longitudinal and transverse dimensions as the target and includes therewithin the array of magnets 17 as shown in FIG. 1.

The magnetic spacers 40 are about 0.06 inches thick and are positioned intermediate the target and cathode as previously discussed. The target plate does not contact the cathode over the area between the magnetic poles and is, therefore, not cooled by the water which circulates through housing 16. This arrangement thus limits the transfer of heat from those selected areas of the target and thus enables the maintenance of those areas during the sputtering process at a temperature at or above the Curie temperature of the target.

Following the connection of the target 30 to the cathode 11, chamber 12 is then evacuated by a suitable vacuum pump 50 down to a level of about $5 \times 10^{-7}$ mmHg. Chamber 12 is then back-filled with high purity argon gas by the action of a piezoelectric needle valve controlled by a Plasmaflow instrument made by Vacuum General. The Plasmaflow instrument controls the argon pressure so that the desired preset discharge voltage is maintained. The starting diode mode pressure is between about 100 to $150 \times 10^{-3}$ mmHg argon. The initial voltage setting is such as to produce a 700 volt potential between the anode and cathode. When this voltage is applied between the anode and the cathode, a plasma discharge is to be expected between the anode and cathode, and the target will begin to heat. To accelerate this heating process, the applied voltage can be increased slowly over a period of about 3 to 5 minutes to approximately 1,500 volts. This has the effect of increasing the anode/cathode current, which in turn increases the level of ion bombardment of the target surface. As the target temperature approaches Curie, the plasma discharge is intensified, first in the vicinity of the grooves on the target located intermediate the magnetic poles. The pressure of the argon gas within the vacuum chamber is then reduced by the Plasmaflow instrument to a working pressure of about $1 \times 10^{-3}$ mmHg. At this time the water supply which cools the magnetron is energized and the feedback network operated to maintain the temperature of the target at a temperature between about 300° and 320° C.

Once the desired target temperature is reached, the apparatus is switched from the diode sputtering mode to the magnetron sputtering mode, with sputtering proceeding under an applied voltage of about 450 volts and a current of about 5 amps. The argon gas pressure remains at about $1 \times 10^{-3}$ mmHg. Under these conditions a magnetic film will be deposited upon the substrate which grows in thickness at the rate of about 0.5 microns per minute. Of course, this deposition rate can be increased by increasing the current. For example, doubling the current to about 10 amps will approximately double the rate of deposition.

After about 20 minutes of sputtering in the magnetron mode, the apparatus is shut down, back-filled with dry nitrogen, and opened to ambient. The resulting magnetic film is approximately 10 microns is thickness, and the magnetic characteristics of the film is near that of the target, but has the columnar morphology necessary for vertical recording media.

While a preferred embodiment of this invention has been described herein, it will be readily appreciated that various modifications and changes can be made thereto without departing from the essence and scope of the invention. For example, it is not critical to the practice of this invention for the magnetic target to comprise a cobalt-chromium alloy. In point of fact, many other materials have been identified by the art which are suitable for producing vertical recording media, but which are, because of their magnetic character, prone to the magnetic flux shunting effects previously discussed. Among these other materials are included alloys or mixtures such as CoX (where X=V, Ti, W, Mo, Rh, Pd, Pt, Re, and combinations thereof), tri-alloys or mixtures such as CoCrTa where Cr and Ta together comprise about 5–28% of the alloy or mixture, and the combination of rare earth and transition metals such as, for example, $Fe_{70}Tb_{15}Gd_{15}$. These and other like materials are considered to be fully equivalent to the Co-Cr alloy specifically discussed. Accordingly, all such modifications and changes are contemplated as may come within the scope of the appended claims.

What is claimed is:

1. A magnetically-assisted sputtering method for producing vertical recording media comprising a substrate and a magnetic film disposed upon a surface portion of said substrate and magnetizeable in a direction substantially normal to said surface portion, said method comprising the steps of heating a magnetic target formed from material which produces said magnetic film to a temperature not less than about its Curie temperature to render said target non-magnetic, and sputtering said target while in a non-magnetic state to deposit said material as said magnetic film upon said substrate.

2. A magnetically-assisted sputtering method as set forth in claim 1 including the step of selectively cooling the portions of said magnetic target through which magnetic flux penetrates to a temperature below said Curie temperature whereby to retain said portions in a magnetic state while sputtering said target.

* * * * *